US009679881B2

(12) United States Patent
Pagaila et al.

(10) Patent No.: US 9,679,881 B2
(45) Date of Patent: *Jun. 13, 2017

(54) SEMICONDUCTOR DEVICE AND METHOD OF FORMING CAVITY ADJACENT TO SENSITIVE REGION OF SEMICONDUCTOR DIE USING WAFER-LEVEL UNDERFILL MATERIAL

(71) Applicant: STATS ChipPAC, Ltd., Singapore (SG)

(72) Inventors: Reza A. Pagaila, Tangerang (ID); Byung Tai Do, Singapore (SG); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/021,206

(22) Filed: Sep. 9, 2013

(65) Prior Publication Data
US 2014/0008769 A1 Jan. 9, 2014

Related U.S. Application Data

(63) Continuation of application No. 12/699,482, filed on Feb. 3, 2010, now Pat. No. 8,574,960.

(51) Int. Cl.
H01L 23/31 (2006.01)
H01L 25/00 (2006.01)
(Continued)

(52) U.S. Cl.
CPC ............ H01L 25/50 (2013.01); H01L 23/315 (2013.01); H01L 25/00 (2013.01);
(Continued)

(58) Field of Classification Search
CPC ..... H01L 23/315; H01L 23/66; H01L 21/563; H01L 21/56; H01L 21/32; H01L 21/28562; H01L 51/001
(Continued)

(56) References Cited

U.S. PATENT DOCUMENTS 4,672,518 A 6/1987 Murdock
4,686,617 A 8/1987 Colton
(Continued)

FOREIGN PATENT DOCUMENTS

WO WO 98/05935 * 2/1998 ............... G01L 9/06
WO WO 2010011177 * 1/2010 ............. H01L 21/68

Primary Examiner — Victoria K Hall
(74) Attorney, Agent, or Firm — Robert D. Atkins; Patent Law Group: Atkins and Associates, P.C.

(57) ABSTRACT

A semiconductor wafer has a plurality of first semiconductor die with a stress sensitive region. A masking layer or screen is disposed over the stress sensitive region. An underfill material is deposited over the wafer. The masking layer or screen prevents formation of the underfill material adjacent to the sensitive region. The masking layer or screen is removed leaving a cavity in the underfill material adjacent to the sensitive region. The semiconductor wafer is singulated into the first die. The first die can be mounted to a build-up interconnect structure or to a second semiconductor die with the cavity separating the sensitive region and build-up interconnect structure or second die. A bond wire is formed between the first and second die and an encapsulant is deposited over the first and second die and bond wire. A conductive via can be formed through the first or second die.

20 Claims, 10 Drawing Sheets

(51) Int. Cl.
*H01L 25/065* (2006.01)
*H01L 21/56* (2006.01)
*H01L 23/66* (2006.01)
*H01L 23/00* (2006.01)

(52) U.S. Cl.
CPC ........ *H01L 25/0657* (2013.01); *H01L 21/563* (2013.01); *H01L 23/66* (2013.01); *H01L 24/73* (2013.01); *H01L 2224/0401* (2013.01); *H01L 2224/0557* (2013.01); *H01L 2224/05571* (2013.01); *H01L 2224/13025* (2013.01); *H01L 2224/16145* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2225/0651* (2013.01); *H01L 2225/06513* (2013.01); *H01L 2225/06541* (2013.01); *H01L 2225/06568* (2013.01); *H01L 2924/0002* (2013.01); *H01L 2924/00011* (2013.01); *H01L 2924/00014* (2013.01); *H01L 2924/01322* (2013.01); *H01L 2924/13091* (2013.01); *H01L 2924/14* (2013.01); *H01L 2924/1461* (2013.01); *H01L 2924/15311* (2013.01); *H01L 2924/181* (2013.01); *H01L 2924/18161* (2013.01)

(58) Field of Classification Search
USPC .................. 257/E23.128, E23.129, E23.134, 257/414–470, 777, 787, 788, 680, 257/E23.001, E23.002, E31.11, E31.117, 257/E31.13, E23.116, E23.123, E23.194, 257/E21.502, E21.503, E23.169; 438/22, 438/25, 28, 33, 48–98, 110–113, 116, 438/117, 127, 455, 456, 458, 759
See application file for complete search history.

(56) References Cited

U.S. PATENT DOCUMENTS

| | | |
|---|---|---|
| 4,885,674 A | 12/1989 | Varga et al. |
| 4,918,450 A | 4/1990 | Sugiyama et al. |
| 5,072,221 A | 12/1991 | Schmidt |
| 5,173,698 A | 12/1992 | Gulczynski |
| 5,182,477 A | 1/1993 | Yamasaki et al. |
| 5,225,837 A | 7/1993 | Hosotani et al. |
| 5,272,701 A | 12/1993 | Tsurnoka |
| 5,296,856 A | 3/1994 | Mantong |
| 5,418,493 A | 5/1995 | Dijkmans |
| 5,510,745 A | 4/1996 | Hamano et al. |
| 5,689,178 A | 11/1997 | Otake |
| 5,734,297 A | 3/1998 | Huijsing et al. |
| 5,789,973 A | 8/1998 | Barrett, Jr. et al. |
| 5,801,564 A | 9/1998 | Gasparik |
| 5,809,060 A | 9/1998 | Cafarella et al. |
| 5,861,829 A | 1/1999 | Sutardja |
| 5,874,009 A * | 2/1999 | Inada et al. ............ 216/20 |
| 5,929,705 A | 7/1999 | Zhang et al. |
| 5,936,466 A | 8/1999 | Andoh et al. |
| 6,002,356 A | 12/1999 | Cooper |
| 6,011,502 A | 1/2000 | Kao |
| 6,081,219 A | 6/2000 | Prasanna |
| 6,111,467 A | 8/2000 | Luo |
| 6,181,269 B1 | 1/2001 | Nishiuchi et al. |
| 6,224,711 B1 | 5/2001 | Carden et al. |
| 6,225,859 B1 | 5/2001 | Irvine et al. |
| 6,232,908 B1 | 5/2001 | Nakaigawa |
| 6,265,776 B1 | 7/2001 | Gilleo |
| 6,281,046 B1 * | 8/2001 | Lam ............... H01L 21/563 257/738 |
| 6,297,560 B1 | 10/2001 | Capote et al. |
| 6,352,881 B1 * | 3/2002 | Nguyen et al. ............ 438/108 |
| 6,369,743 B2 | 4/2002 | Ono |
| 6,373,423 B1 | 4/2002 | Knudsen |
| 6,379,988 B1 | 4/2002 | Peterson et al. |
| 6,404,372 B1 | 6/2002 | Heithoff |
| 6,404,374 B1 | 6/2002 | Yu et al. |
| 6,432,737 B1 * | 8/2002 | Webster ............... B81B 7/0077 257/419 |
| 6,556,081 B2 | 4/2003 | Muza |
| 6,556,158 B2 | 4/2003 | Steensgaard-Madsen |
| 6,563,445 B1 | 5/2003 | Sabouri |
| 6,580,382 B2 | 6/2003 | Yung |
| 6,600,373 B1 | 7/2003 | Bailey et al. |
| 6,605,993 B2 | 8/2003 | Suzuki |
| 6,653,966 B1 | 11/2003 | van der Goes et al. |
| 6,717,945 B1 | 4/2004 | Jue et al. |
| 6,744,432 B1 | 6/2004 | Morein |
| 6,756,841 B2 | 6/2004 | Jaussi et al. |
| 6,784,824 B1 | 8/2004 | Quinn |
| 6,800,946 B2 | 10/2004 | Chason et al. |
| 6,816,101 B2 | 11/2004 | Hietala et al. |
| 6,922,083 B2 | 7/2005 | Tanaka et al. |
| 6,933,605 B2 | 8/2005 | Tao et al. |
| 6,956,517 B1 | 10/2005 | Baker et al. |
| 7,002,504 B2 | 2/2006 | McMahill |
| 7,019,507 B1 | 3/2006 | Dittmer et al. |
| 7,109,061 B2 | 9/2006 | Crane et al. |
| 7,116,260 B2 | 10/2006 | Luh |
| 7,129,874 B2 | 10/2006 | Bjornsen |
| 7,190,298 B2 | 3/2007 | Mulder |
| 7,209,068 B1 | 4/2007 | Chen et al. |
| 7,233,277 B2 | 6/2007 | Roh |
| 7,262,724 B2 | 8/2007 | Hughes et al. |
| 7,333,580 B2 | 2/2008 | Parhi |
| 7,355,273 B2 | 4/2008 | Jackson et al. |
| 7,362,153 B2 | 4/2008 | Sumesaglam |
| 7,445,959 B2 | 11/2008 | Theuss |
| 7,471,228 B2 | 12/2008 | Cho et al. |
| 7,482,844 B2 | 1/2009 | Brady et al. |
| 7,576,426 B2 | 8/2009 | Gan et al. |
| 7,696,915 B2 | 4/2010 | Chmelar et al. |
| 7,759,135 B2 | 7/2010 | Theuss |
| 8,367,470 B2 | 2/2013 | Pagaila |
| 8,368,187 B2 | 2/2013 | Pagaila |
| 8,574,960 B2 * | 11/2013 | Pagaila ............... H01L 25/0657 257/777 |
| 2002/0089380 A1 * | 7/2002 | Fujioka .................. H03F 3/193 330/302 |
| 2002/0186776 A1 | 12/2002 | Cosand |
| 2003/0132480 A1 * | 7/2003 | Chau ................ H01L 27/088 257/332 |
| 2003/0148597 A1 * | 8/2003 | Tan .................. H01L 23/3128 438/612 |
| 2003/0155639 A1 * | 8/2003 | Nakamura et al. ............ 257/680 |
| 2003/0211654 A1 * | 11/2003 | Kocian ................ B81C 99/004 438/116 |
| 2004/0012086 A1 | 1/2004 | Infantolino et al. |
| 2004/0104462 A1 * | 6/2004 | Tao ................... H01L 21/563 257/686 |
| 2004/0118599 A1 * | 6/2004 | Chason ............... B81C 1/00333 174/260 |
| 2004/0169275 A1 * | 9/2004 | Danvir et al. ................. 257/737 |
| 2004/0188838 A1 * | 9/2004 | Okada .................. G06K 9/0002 257/738 |
| 2004/0250755 A1 * | 12/2004 | Ivanov ................ C23C 18/1619 118/50 |
| 2005/0046044 A1 | 3/2005 | Theuss |
| 2005/0151588 A1 | 7/2005 | Bailey et al. |
| 2005/0266670 A1 | 12/2005 | Lin et al. |
| 2006/0019467 A1 * | 1/2006 | Lee .................. H01L 21/78 438/462 |
| 2006/0060956 A1 * | 3/2006 | Tanikella ............. H01L 21/4857 257/686 |
| 2006/0071709 A1 | 4/2006 | Maloberti et al. |
| 2006/0132242 A1 | 6/2006 | Han et al. |
| 2007/0045795 A1 * | 3/2007 | McBean ............... B81C 1/00269 257/678 |
| 2007/0120248 A1 * | 5/2007 | Yoshimura ........ H01L 23/49827 257/698 |

(56) References Cited

U.S. PATENT DOCUMENTS

| | | |
|---|---|---|
| 2007/0183006 A1 | 8/2007 | Lee |
| 2007/0215927 A1* | 9/2007 | Kuramochi ........... H01L 21/563 |
| | | 257/301 |
| 2008/0009102 A1 | 1/2008 | Yang et al. |
| 2008/0048896 A1 | 2/2008 | Parthasarthy et al. |
| 2008/0116481 A1* | 5/2008 | Sharma ............ H01L 21/28079 |
| | | 257/175 |
| 2008/0128838 A1 | 6/2008 | Theuss |
| 2008/0185706 A1 | 8/2008 | Wang |
| 2008/0198561 A1* | 8/2008 | Oiwa ..................... H01L 23/66 |
| | | 361/740 |
| 2008/0283993 A1* | 11/2008 | Sanchez ................. H01L 24/06 |
| | | 257/686 |
| 2008/0293446 A1* | 11/2008 | Rofougaran ...... H01L 23/49855 |
| | | 455/552.1 |
| 2008/0318396 A1 | 12/2008 | Shin et al. |
| 2009/0014848 A1* | 1/2009 | Ong Wai Lian .... H01L 23/4952 |
| | | 257/666 |
| 2009/0017613 A1* | 1/2009 | Honda .................. H01L 21/561 |
| | | 438/637 |
| 2009/0026633 A1 | 1/2009 | Hsu |
| 2011/0031634 A1 | 2/2011 | Pagaila |

* cited by examiner

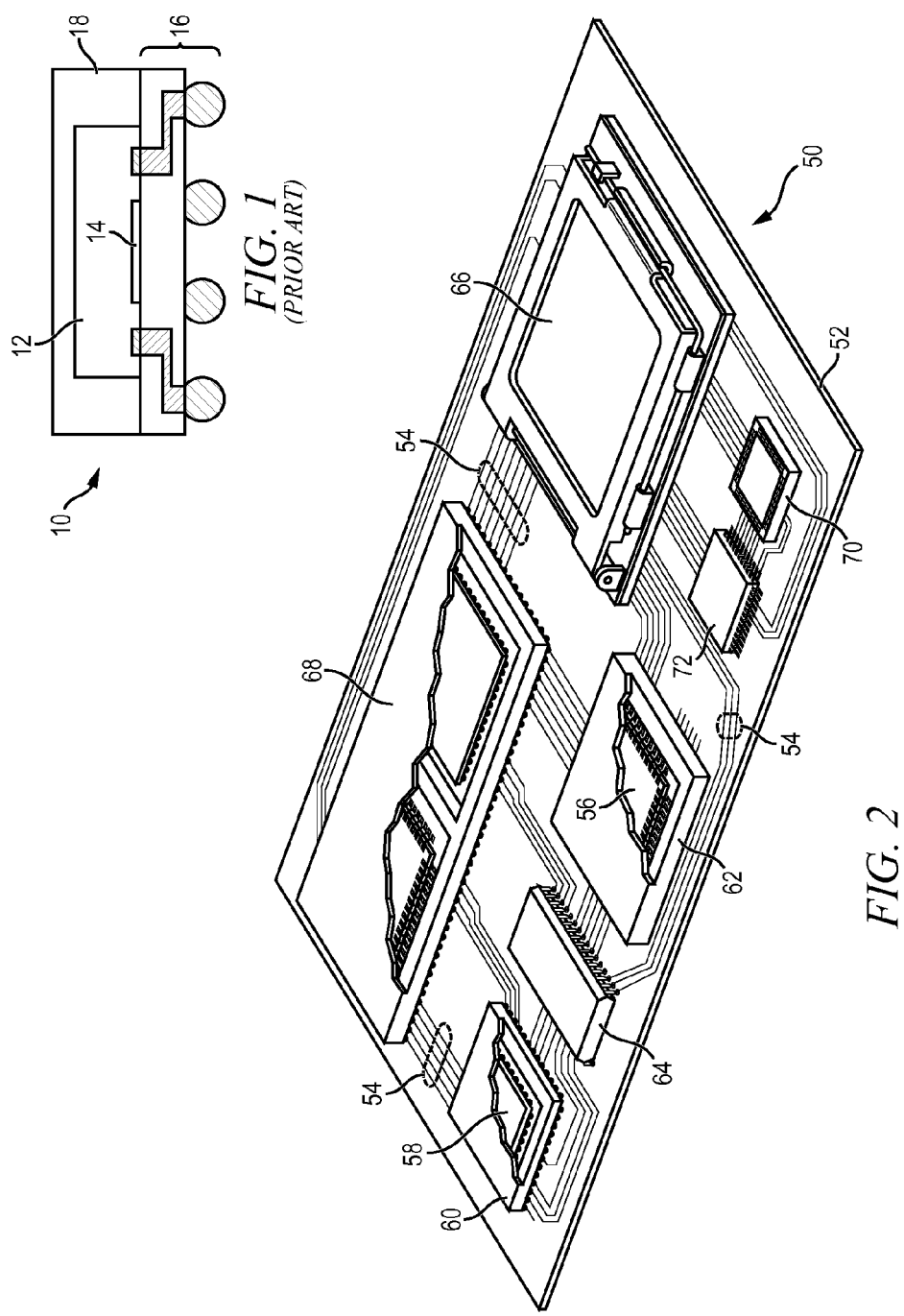

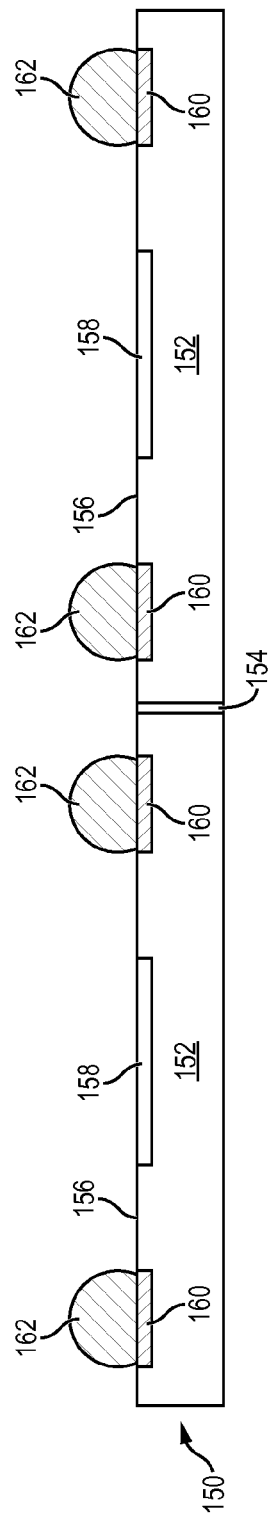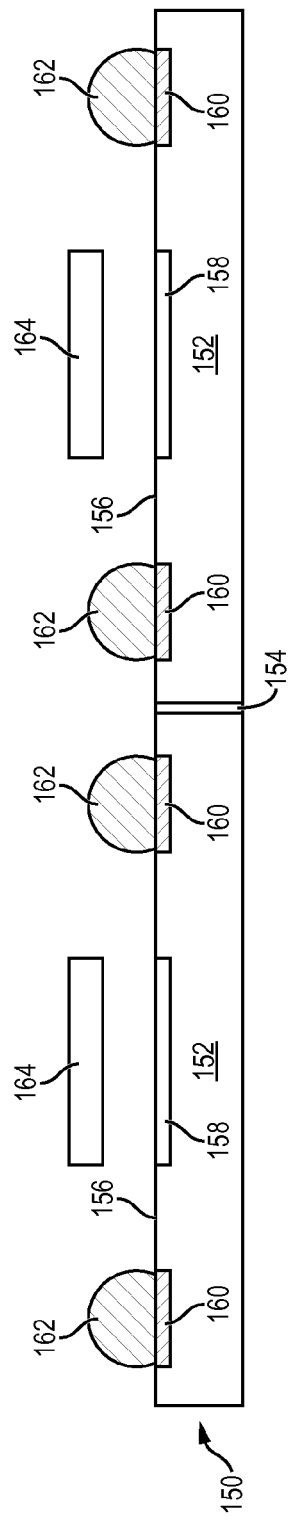

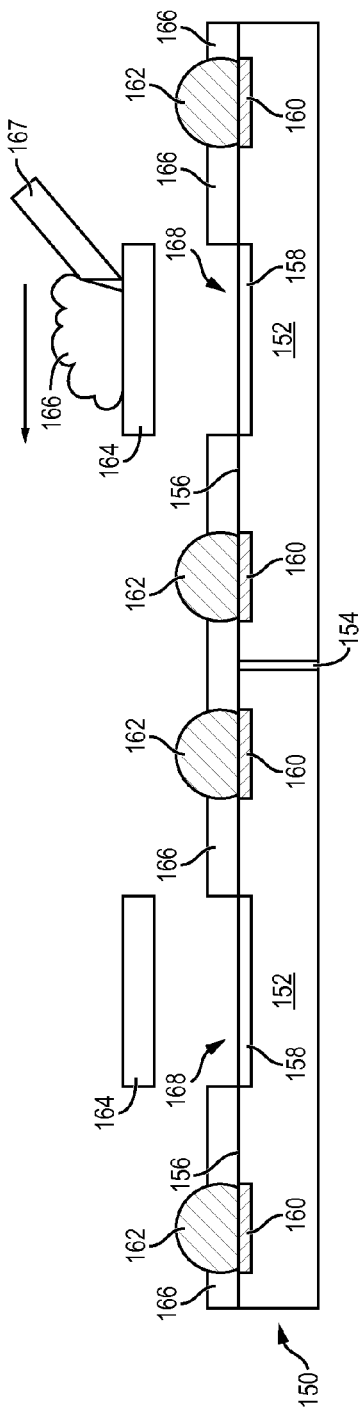
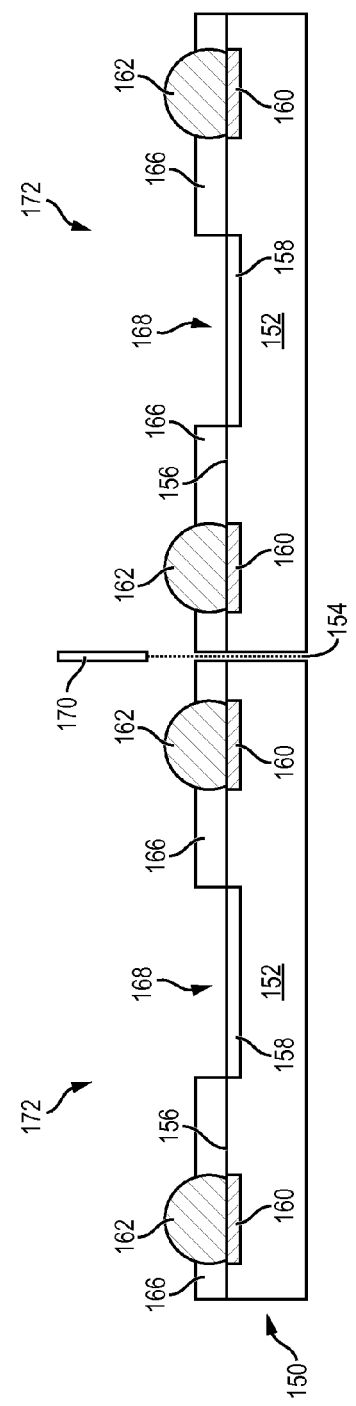
FIG. 5c
FIG. 5e

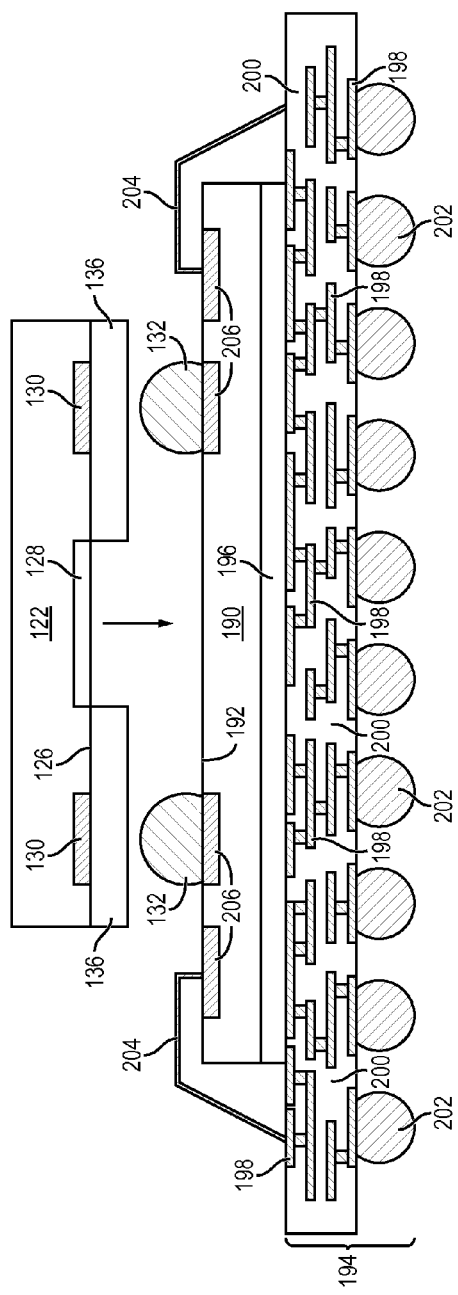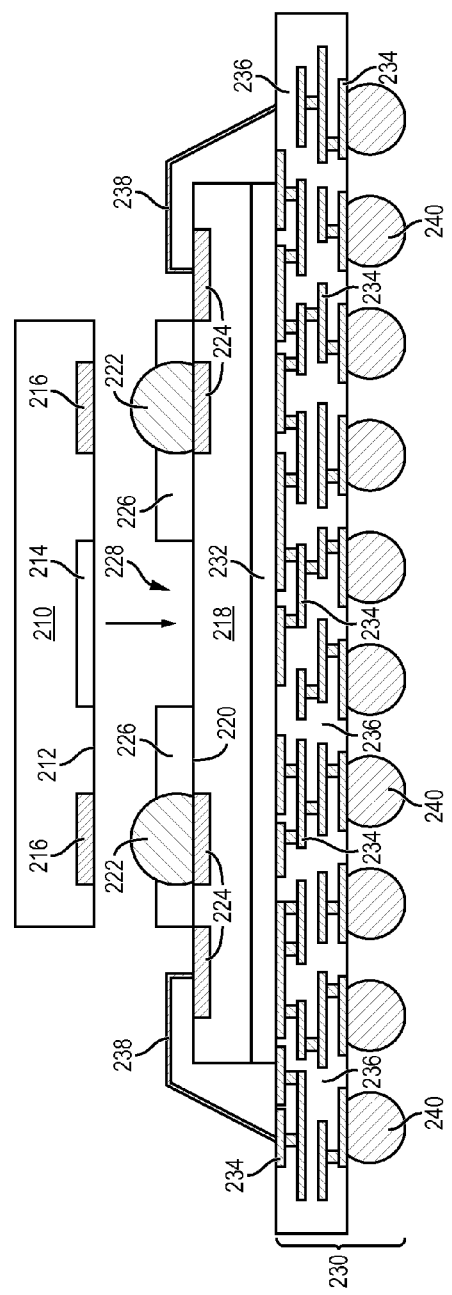

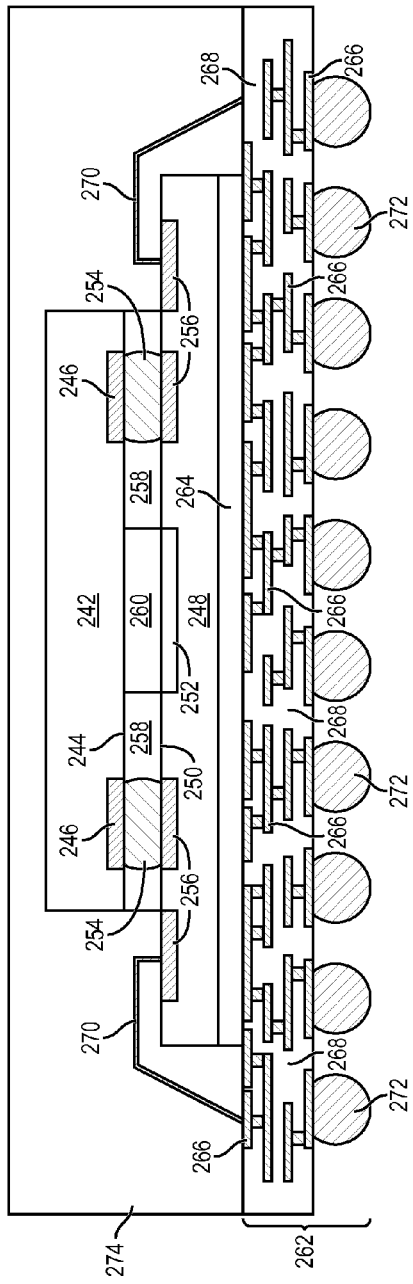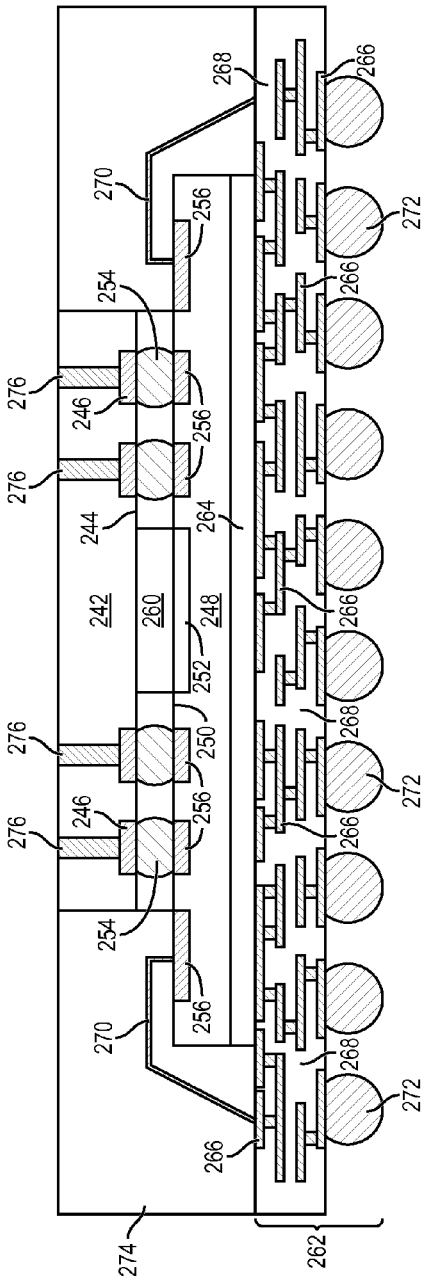

SEMICONDUCTOR DEVICE AND METHOD OF FORMING CAVITY ADJACENT TO SENSITIVE REGION OF SEMICONDUCTOR DIE USING WAFER-LEVEL UNDERFILL MATERIAL

CLAIM TO DOMESTIC PRIORITY

The present application is a continuation of U.S. patent application Ser. No. 12/699,482, now U.S. Pat. No. 8,574,960, filed Feb. 3, 2010, which application is incorporated herein by reference.

FIELD OF THE INVENTION

The present invention relates in general to semiconductor devices and, more particularly, to a semiconductor device and method of forming a cavity adjacent to a stress sensitive region of a semiconductor die using wafer-level underfill material.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

These high-performance semiconductor devices have regions that are particularly sensitive to various forms of stress, e.g. thermally induced stress. For example, FIG. 1 shows a conventional semiconductor package 10 containing semiconductor die 12 having stress sensitive region 14. Region 14 contains high frequency signal processing circuits, which are sensitive to stress. A build-up interconnect structure 16 is formed over semiconductor die 12 such that the interconnect structure physically contacts region 14. Encapsulant 18 is deposited over semiconductor die 12 and interconnect structure 16.

Due to differences in the coefficient of thermal expansion (CTE) between region 14 and interconnect structure 16, the high frequency region can be exposed to thermal stress which can interfere with signal processing, cause device failure, and reduce the life expectancy of the device.

SUMMARY OF THE INVENTION

A need exists to reduce stress on the high frequency region of a semiconductor die. Accordingly, in one embodiment, the present invention is a method of making a semiconductor device comprising the steps of providing a first semiconductor die including a stress sensitive region, forming an insulating layer over the first semiconductor die with an opening in the insulating layer aligned with the stress sensitive region, providing an interconnect structure, and disposing the first semiconductor die over the interconnect structure with the stress sensitive region separated from the interconnect structure.

In another embodiment, the present invention is a method of making a semiconductor device comprising the steps of providing a first semiconductor die including a stress sensitive region, and forming an insulating layer over a surface of the first semiconductor die with an opening in the insulating layer aligned with the stress sensitive region.

In another embodiment, the present invention is a semiconductor device comprising a first semiconductor die including a stress sensitive region. An insulating layer is formed over the first semiconductor die with an opening in the insulating layer aligned with the stress sensitive region. An interconnect structure with the first semiconductor die disposed over the interconnect structure with the stress sensitive region separated from the interconnect structure.

In another embodiment, the present invention is a semiconductor device comprising a first semiconductor die including a stress sensitive region. An insulating layer is formed over a surface of the first semiconductor die with an opening in the insulating layer aligned with the stress sensitive region.

BRIEF DESCRIPTION OF THE DRAWINGS

FIG. 1 illustrates a conventional semiconductor die having a stress sensitive region in physical contact with a build-up interconnect structure;

FIG. 2 illustrates a PCB with different types of packages mounted to its surface;

FIGS. 5a-5e illustrate a screen printing process to form a cavity adjacent to a stress sensitive region of a semiconductor die using wafer-level underfill material;

FIG. 8 illustrates the interconnect bumps initially formed on the lower semiconductor die;

FIG. 9 illustrates the cavity formed over the lower semiconductor die;

FIG. 10 illustrates the lower semiconductor die having the stress sensitive region; and FIG. 11 illustrates conductive TSVs formed through the upper semiconductor.

DETAILED DESCRIPTION OF THE DRAWINGS

Figure 3A:
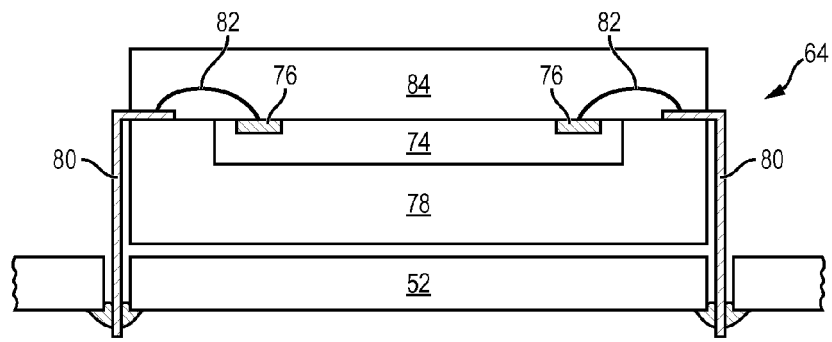
FIGS. 3a-3c illustrate further detail of the representative semiconductor packages mounted to the PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3B:
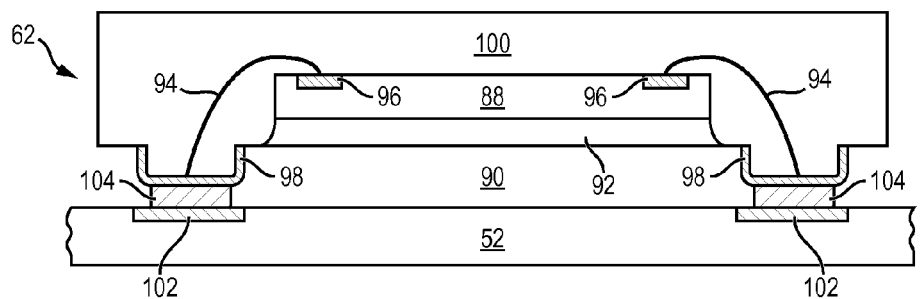
Figure 3C:
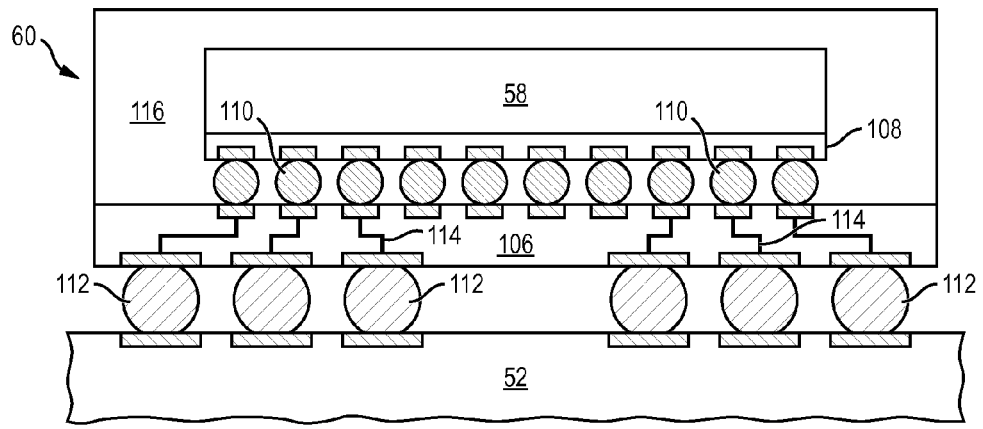

FIGS. 3a-3c show exemplary semiconductor packages. FIG. 3a illustrates further detail of DIP 64 mounted on PCB 52. Semiconductor die 74 has an active region containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
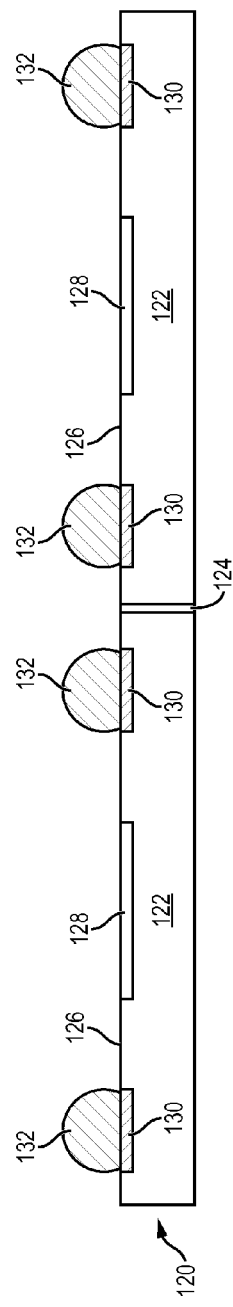
FIGS. 4a-4f illustrate a masking process to form a cavity adjacent to a stress sensitive region of a semiconductor die using wafer-level underfill material.

FIGS. 4a-4f illustrate, in relation to FIGS. 2 and 3a-3c, a masking process using wafer-level underfill material to form a cavity adjacent to a stress sensitive region of a semiconductor die containing high frequency signal processing circuits. FIG. 4a shows a semiconductor wafer 120 with a base substrate material, such as silicon, germanium, gallium arsenide, indium phosphide, or silicon carbide, for structural support. A plurality of semiconductor die or components 122 is formed on wafer 120 separated by saw streets 124 as described above.

Each semiconductor die 122 has an active surface 126 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 126 to implement analog circuits or digital circuits, such as digital signal processor (DSP), ASIC, memory, or other signal processing circuit. In one embodiment, semiconductor die 122 is a flipchip type device.

Semiconductor die 122 may also contain IPDS, such as inductors, capacitors, and resistors, for RF signal processing. A typical RF system requires multiple IPDs in one or more semiconductor packages to perform the necessary electrical functions. In particular, active region 126 includes a stress sensitive region 128 containing high frequency signal processing circuits for RF, sensor, and micro electrical mechanical system (MEMS) applications. Any stress asserted against sensitive region 128, for example thermally induced stress, can adversely affect the signal processing of the die, cause device failures, or shorten life expectancy of the device. Contact pads 130 are electrically connected to the circuits on active surface 126. Bumps 132 are formed on contact pads 130 of wafer 120 for external interconnect. Alternatively, the interconnect structure formed on contact pads 130 can be stacked stud bumps or conductive pillars.

Figure 4B:
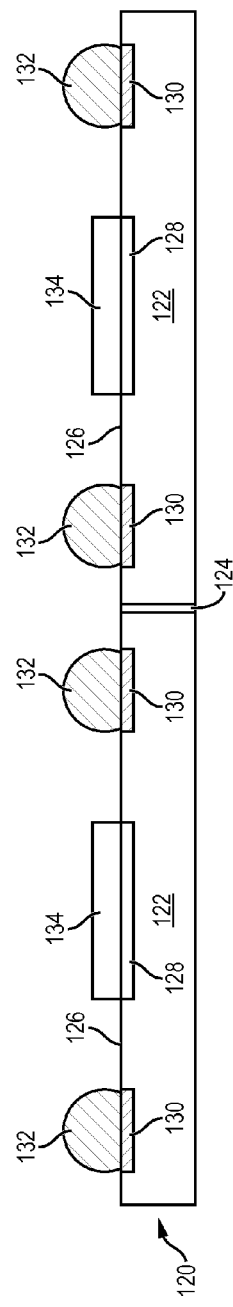
Figure 4C:
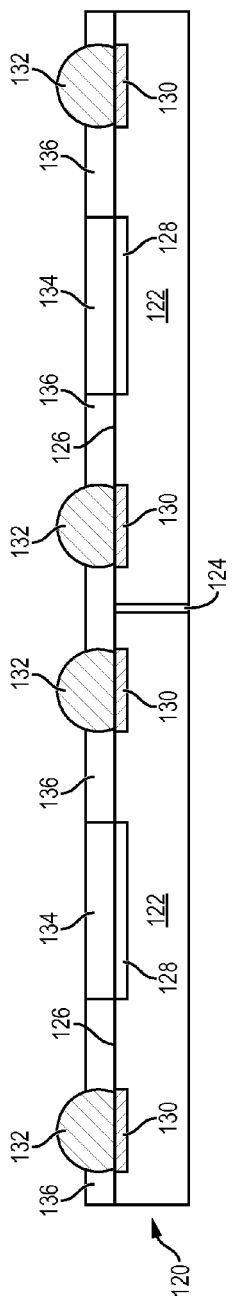
Figure 4D:
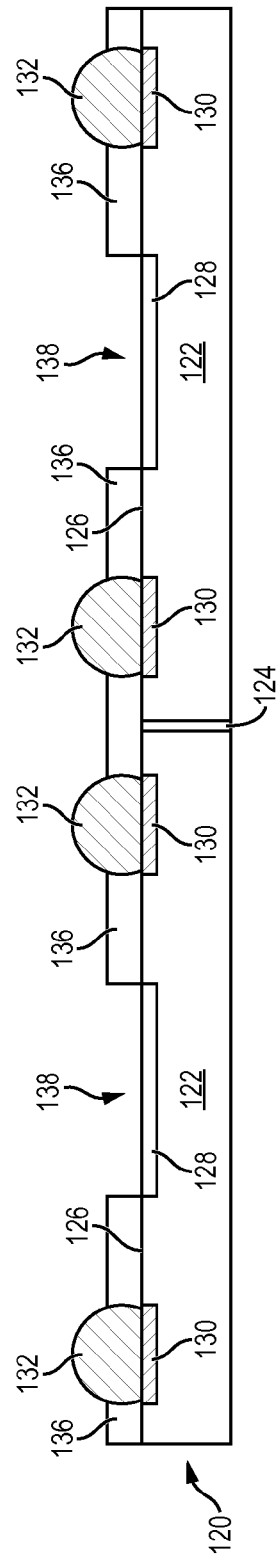
Figure 4F:
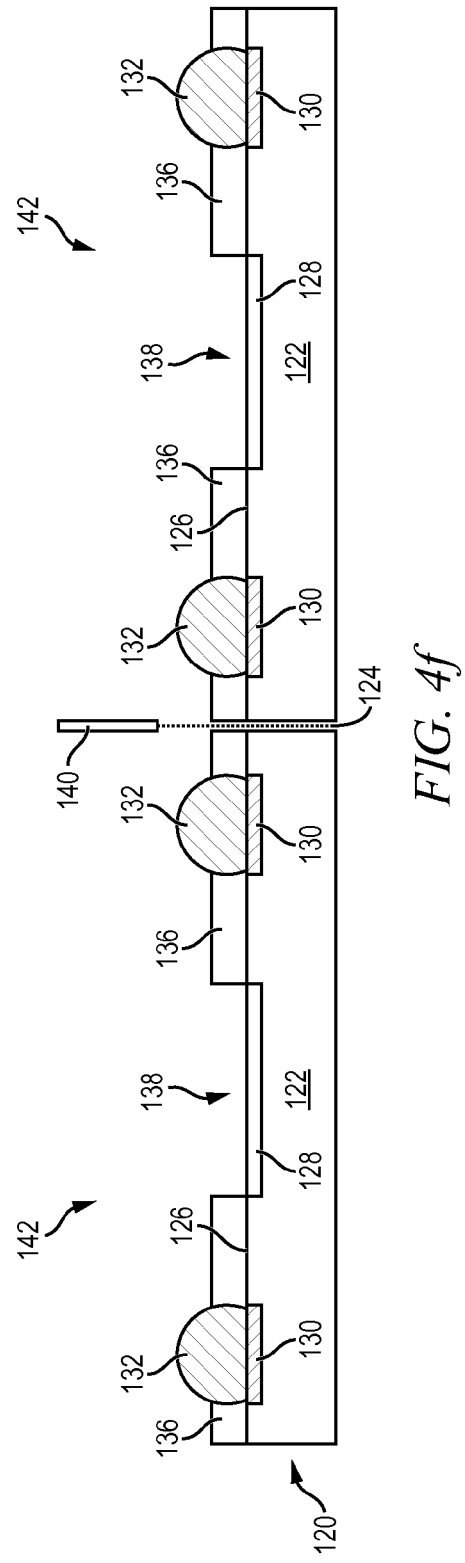
Figure 4E:
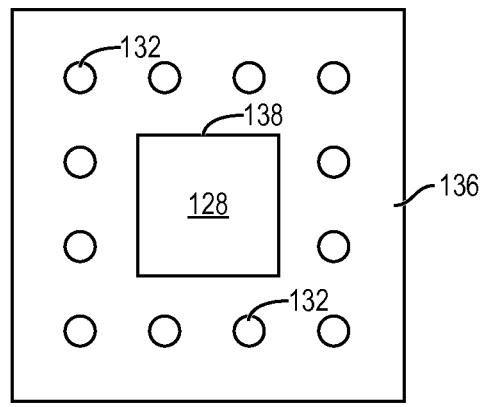

In FIG. 4b, a masking layer 134 is formed over sensitive region 128. An underfill material 136 is deposited over active surfaces 126 of wafer 120, as shown in FIG. 4c. The dispensing of underfill material 136 occurs at the wafer level after formation of bumps 132 for higher throughput as compared to capillary underfill dispensing. The wafer-level underfill process also reduces formation of voids in underfill material 136. Masking layer 134 covers stress sensitive region 128 and prevents underfill material 136 from forming over the sensitive region. In FIG. 4d, masking layer 134 is removed by chemical etching, ultra-violet (UV), heat, laser scanning, or wet stripping leaving underfill material 136 over active surface 126 except for sensitive region 128. The removal of masking layer 134 over sensitive region 128 forms cavity 138. FIG. 4e shows a top view of underfill material 136 formed over active surface 126 and surrounding stress sensitive region 128 to form cavity 138 adjacent to the sensitive region. Semiconductor die 122 are singulated with saw blade or laser cutting tool 140 into individual semiconductor devices 142, as shown in FIG. 4f.

Figure 5D:
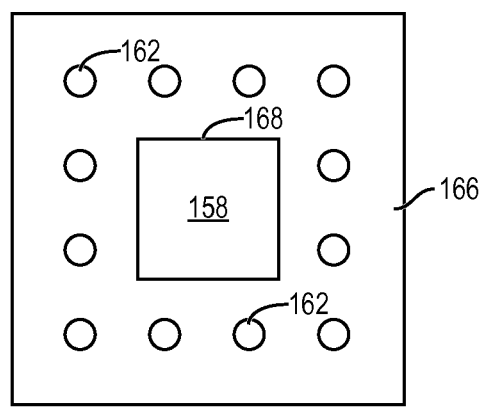

FIGS. 5a-5e illustrate a screen printing process using wafer-level underfill material to form a cavity adjacent to a stress sensitive region of a semiconductor die containing high frequency signal processing circuits. FIG. 5a shows a semiconductor wafer 150 with a base substrate material, such as silicon, germanium, gallium arsenide, indium phosphide, or silicon carbide, for structural support. A plurality of semiconductor die or components 152 is formed on wafer 150 separated by saw streets 154 as described above.

Each semiconductor die 152 has an active surface 156 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 156 to implement analog circuits or digital circuits, such as DSP, ASIC, memory, or other signal processing circuit. In one embodiment, semiconductor die 152 is a flipchip type device.

Semiconductor die 152 may also contain IPDS, such as inductors, capacitors, and resistors, for RF signal processing. A typical RF system requires multiple IPDs in one or more semiconductor packages to perform the necessary electrical functions. In particular, active region 156 includes a stress sensitive region 158 containing high frequency signal processing circuits for RF, sensor, and MEMS applications. Any stress asserted against sensitive region 158, for example thermally induced stress, can adversely affect the signal processing of the die, cause device failures, or shorten life expectancy of the device. Contact pads 160 are electrically connected to the circuits on active surface 156. Bumps 162 are formed on contact pads 160 of wafer 150 for external interconnect. Alternatively, the interconnect structure formed on contact pads 160 can be stacked stud bumps or conductive pillars.

In FIG. 5b, a screen 164 is placed over sensitive region 158. An underfill material 166 is deposited by a squeegee 167 over active surface 156 of wafer 150 using screen or stencil printing process, see FIG. 5c. The dispensing of underfill material 166 occurs at the wafer level after formation of bumps 162 for higher throughput as compared to capillary underfill dispensing. The wafer-level underfill process also reduces formation of voids in underfill material 166. Screen 164 covers stress sensitive region 158 and prevents underfill material 166 from forming over the sensitive region. The absence of underfill material 166 over sensitive region 158 forms cavity 168. FIG. 5d shows a top view of underfill material 166 formed over active surface 156 and surrounding stress sensitive region 158 to form cavity 168 adjacent to the sensitive region. Semiconductor die 152 are singulated with saw blade or laser cutting tool 170 into individual semiconductor devices 172, as shown in FIG. 5e.

Figure 6:
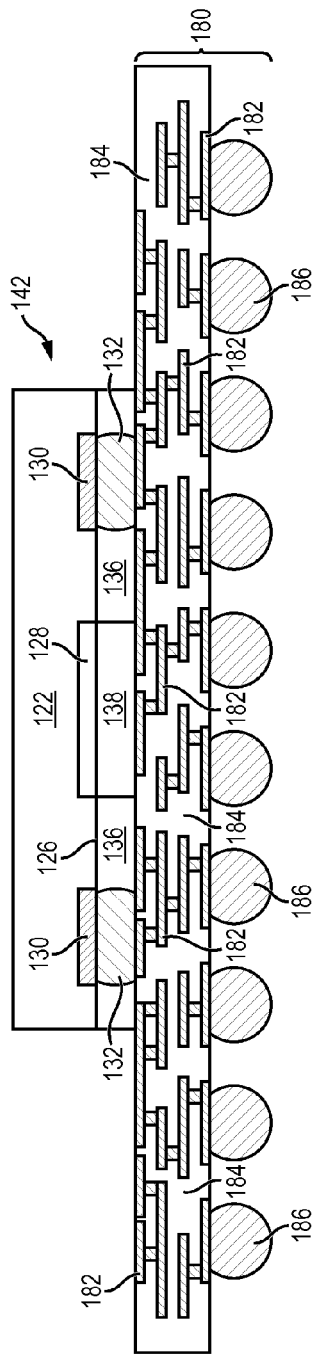
FIG. 6 illustrates the semiconductor die with a cavity adjacent to a stress sensitive region mounted to a build-up interconnect structure.

FIG. 6 shows semiconductor device 142 (or 172) mounted to build-up interconnect structure 180. The build-up interconnect structure 180 includes an electrically conductive layer 182 formed using patterning and PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 is electrically connected to bumps 132.

The build-up interconnect structure 180 further includes an insulating or passivation layer 184 formed by PVD, CVD, printing, spin coating, spray coating, or thermal oxidation. The insulating layer 184 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties.

An electrically conductive bump material is deposited over conductive layer 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 182 using a suitable attachment or bonding process. In one embodiment, the bump material is reflowed by heating the material above its melting point to form spherical balls or bumps 186. In some applications, bumps 186 are reflowed a second time to improve electrical contact to conductive layer 182. The bumps can also be compression bonded to conductive layer 182. Bumps 186 represent one type of interconnect structure that can be formed over conductive layer 182. The interconnect structure can also use bond wires, conductive paste, stud bump, micro bump, or other electrical interconnect.

The circuits on active surface 126 of semiconductor die 122 are electrically connected to build-up interconnect structure 180 by way of contact pads 130, bumps 132 and 186, and conductive layer 182 for further package integration. In addition, conductive TSVs can be formed through semiconductor die 122 for vertical interconnect, as shown in FIG. 11. Semiconductor device 142 has cavity 138 formed adjacent to stress sensitive region 128 to create an air gap between build-up interconnect structure 180 and sensitive region 128. The air gap 138 eliminates stress on sensitive region 128 to avoid device failure and adverse influence on signal processing of semiconductor die 122. Since sensitive area 128 is not covered by underfill material 136, signal processing is not disrupted and electrical performance is maintained. In addition, wafer-level dispensing of underfill material 136 provides higher throughput and reduces formation of voids in the underfill material.

Figure 7:
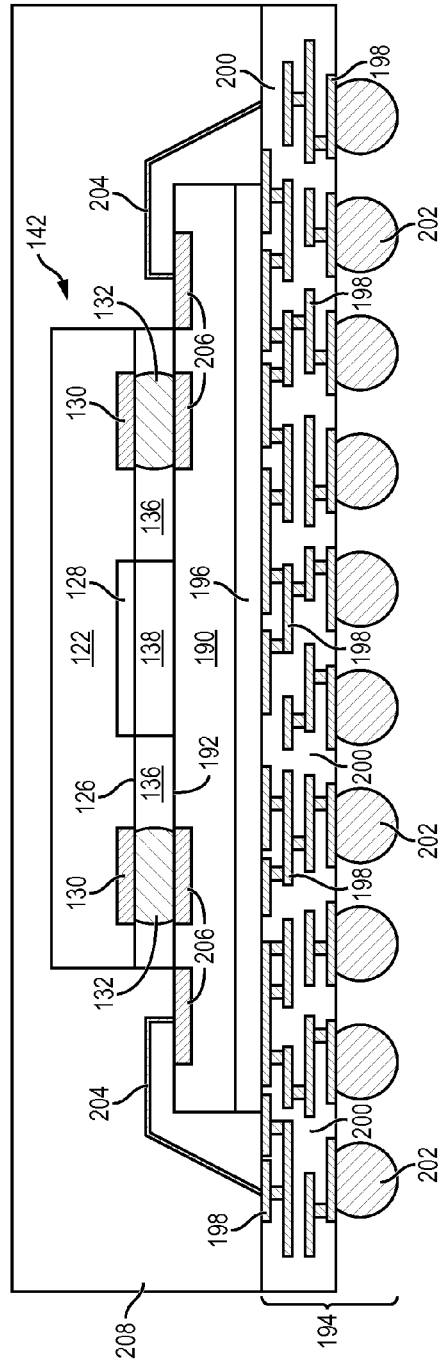
FIG. 7 illustrates the semiconductor die with a cavity adjacent to a stress sensitive region mounted to another semiconductor die and build-up interconnect structure.

FIG. 7 shows another embodiment with semiconductor device 142 (or 172) mounted to semiconductor die 190 using bumps 132. Semiconductor die 190 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 192 to implement analog circuits or digital circuits, such as DSP, ASIC, memory, or other signal processing circuit. Semiconductor die 190 may also contain IPDS, such as inductors, capacitors, and resistors, for RF signal processing.

Semiconductor die 190 is mounted to build-up interconnect structure 194 with adhesive layer 196. The build-up interconnect structure 194 includes an electrically conductive layer 198 formed using patterning and PVD, CVD, electrolytic plating, electroless plating process, or other suitable metal deposition process. Conductive layer 198 can be one or more layers of Al, Cu, Sn, Ni, Au, Ag, or other suitable electrically conductive material. The build-up interconnect structure 194 further includes an insulating or passivation layer 200 formed by PVD, CVD, printing, spin coating, spray coating, or thermal oxidation. The insulating layer 200 can be one or more layers of SiO2, Si3N4, SiON, Ta2O5, Al2O3, or other material having similar insulating and structural properties.

An electrically conductive bump material is deposited over conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 202. In some applications, bumps 202 are reflowed a second time to improve electrical contact to conductive layer 198. The bumps can also be compression bonded to conductive layer 198. Bumps 202 represent one type of interconnect structure that can be formed over conductive layer 198. The interconnect structure can also use bond wires, conductive paste, stud bump, micro bump, or other electrical interconnect.

Bond wires 204 are formed between contact pads 206 on semiconductor die 190 and conductive layer 198. An encapsulant or molding compound 208 is deposited over semiconductor die 122 and 190, bond wires 204, and build-up interconnect structure 194 using a paste printing, compressive molding, transfer molding, liquid encapsulant molding, vacuum lamination, spin coating, or other suitable applicator. Encapsulant 208 can be polymer composite material, such as epoxy resin with filler, epoxy acrylate with filler, or polymer with proper filler. Encapsulant 208 is non-conductive and environmentally protects the semiconductor device from external elements and contaminants.

The circuits on semiconductor die 122 and 190 are electrically connected to build-up interconnect structure 194 by way of contact pads 130 and 206, bumps 132 and 202, bond wires 204, and conductive layer 198 for further package integration. In addition, conductive TSVs can be formed through semiconductor die 122 and 190 for vertical interconnect, as shown in FIG. 11. Semiconductor device 142 has cavity 138 formed adjacent to stress sensitive region 128 to create an air gap between semiconductor die 190 and sensitive region 128. The air gap 138 eliminates stress on sensitive region 128 to avoid device failure and adverse influence on signal processing of semiconductor die 122. Since sensitive area 128 is not covered by underfill material 136, signal processing is not disrupted and electrical performance is maintained. In addition, wafer-level dispensing of underfill material 136 provides higher throughput and reduces formation of voids in the underfill material.

FIG. 8 shows a variation of the embodiment of FIG. 7 with bumps 132 initially formed on contact pads 206. Bumps 132 are pressed through underfill material 136 when mounting semiconductor die 122 to semiconductor die 190. An encapsulant is deposited over semiconductor die 122 and 190, bond wires 204, and build-up interconnect structure 194. Bumps are formed on conductive layer 198 resulting in the structure shown in FIG. 7.

FIG. 9 shows another embodiment with semiconductor die 210 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 212 to implement analog circuits or digital circuits, such as DSP, ASIC, memory, or other signal processing circuit.

Semiconductor die 210 may also contain IPDS, such as inductors, capacitors, and resistors, for RF signal processing. In particular, active region 212 includes a stress sensitive region 214 containing high frequency signal processing circuits for RF, sensor, and MEMS applications. Any stress asserted against sensitive region 214, for example thermally induced stress, can adversely affect the signal processing of the die, cause device failures, or shorten life expectancy of the device. Contact pads 216 are electrically connected to the circuits on active surface 212.

Semiconductor die 218 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 220 to implement analog circuits or digital circuits, such as DSP, ASIC, memory, or other signal processing circuit. Semiconductor die 218 may also contain IPDS, such as inductors, capacitors, and resistors, for RF signal processing. Bumps 222 are formed on contact pads 224 for external interconnect. Alternatively, the interconnect structure formed on contact pads 224 can be stacked stud bumps or conductive pillars.

An underfill material 226 is deposited over active surface 220 using masking layer or screen printing process to form cavity 228, as described in FIGS. 4-5.

Semiconductor die 218 is mounted to build-up interconnect structure 230 with adhesive layer 232. The build-up interconnect structure 230 includes an electrically conductive layer 234 formed using patterning and PVD, CVD, electrolytic plating, electroless plating process, or other suitable metal deposition process. Conductive layer 234 can be one or more layers of Al, Cu, Sn, Ni, Au, Ag, or other suitable electrically conductive material. The build-up interconnect structure 230 further includes an insulating or passivation layer 236 formed by PVD, CVD, printing, spin coating, spray coating, or thermal oxidation. The insulating layer 236 can be one or more layers of SiO2, Si3N4, SiON, Ta2O5, Al2O3, or other material having similar insulating and structural properties. Bond wires 238 are formed between contact pads 224 and conductive layer 234.

An electrically conductive bump material is deposited over conductive layer 234 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 234 using a suitable attachment or bonding process. In one embodiment, the bump material is reflowed by heating the material above its melting point to form spherical balls or bumps 240. In some applications, bumps 240 are reflowed a second time to improve electrical contact to conductive layer 234. The bumps can also be compression bonded to conductive layer 234. Bumps 240 represent one type of interconnect structure that can be formed over conductive layer 234. The interconnect structure can also use bond wires, conductive paste, stud bump, micro bump, or other electrical interconnect.

Semiconductor die 210 is positioned over semiconductor die 218 so that stress sensitive region 214 aligns with cavity 228. Bumps 222 are metallurgically and electrically connected to contact pads 216. An encapsulant is deposited over semiconductor die 210 and 218, bond wires 238, and build-up interconnect structure 230, resulting in the structure shown in FIG. 7.

The circuits on active surface 212 of semiconductor die 210 and active surface 220 of semiconductor die 218 are electrically connected to build-up interconnect structure 194 by way of contact pads 216 and 224, bumps 222 and 240, bond wires 238, and conductive layer 234 for further package integration. In addition, conductive TSVs can be formed through semiconductor die 210 and 218 for vertical interconnect, as shown in FIG. 11. Cavity 228 is formed adjacent to stress sensitive region 214 to create an air gap between semiconductor die 218 and sensitive region 214. Cavity 228 eliminates stress on sensitive region 214 to avoid device failure and adverse influence on signal processing of semiconductor die 210.

FIG. 10 shows another embodiment with semiconductor die 242 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 244 to implement analog circuits or digital circuits, such as DSP, ASIC, memory, or other signal processing circuit. Semiconductor die 242 may also contain IPDS, such as inductors, capacitors, and resistors, for RF signal processing. Contact pads 246 are electrically connected to the circuits on active surface 244.

Semiconductor die 248 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 250 to implement analog circuits or digital circuits, such as DSP, ASIC, memory, or other signal processing circuit. Semiconductor die 248 may also contain IPDS, such as inductors, capacitors, and resistors, for RF signal processing. In particular, active region 250 includes a stress sensitive region 252 containing high frequency signal processing circuits for RF, sensor, and MEMS applications. Any stress asserted against sensitive region 252, for example thermally induced stress, can adversely affect the signal processing of the die, cause device failures, or shorten life expectancy of the device. Bumps 254 are formed on contact pads 246 or 256 for external interconnect. Alternatively, the interconnect structure formed on contact pads 246 or 256 can be stacked stud bumps or conductive pillars.

An underfill material 258 is deposited over active surface 244 or active surface 250 using masking layer or screen printing process to form cavity 260, as described in FIGS. 4-5.

Semiconductor die 248 is mounted to build-up interconnect structure 262 with adhesive layer 264. The build-up interconnect structure 262 includes an electrically conductive layer 266 formed using patterning and PVD, CVD, electrolytic plating, electroless plating process, or other suitable metal deposition process. Conductive layer 266 can be one or more layers of Al, Cu, Sn, Ni, Au, Ag, or other suitable electrically conductive material. The build-up interconnect structure 262 further includes an insulating or passivation layer 268 formed by PVD, CVD, printing, spin coating, spray coating, or thermal oxidation. The insulating layer 268 can be one or more layers of SiO2, Si3N4, SiON, Ta2O5, Al2O3, or other material having similar insulating and structural properties. Bond wires 270 are formed between contact pads 256 and conductive layer 266.

An electrically conductive bump material is deposited over conductive layer 266 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 266 using a suitable attachment or bonding process. In one embodiment, the bump material is reflowed by heating the material above its melting point to form spherical balls or bumps 272. In some applications, bumps 272 are reflowed a second time to improve electrical contact to conductive layer 266. The bumps can also be compression bonded to conductive layer 266. Bumps 272 represent one type of interconnect structure that can be formed over conductive layer 266. The interconnect structure can also use bond wires, conductive paste, stud bump, micro bump, or other electrical interconnect.

Semiconductor die 242 is positioned over semiconductor die 248 so that stress sensitive region 252 aligns with cavity 260. Bumps 254 are metallurgically and electrically connected to contact pads 246 and 256. An encapsulant or molding compound 274 is deposited over semiconductor die 242 and 248, bond wires 270, and build-up interconnect structure 262 using a paste printing, compressive molding, transfer molding, liquid encapsulant molding, vacuum lamination, spin coating, or other suitable applicator. Encapsulant 274 can be polymer composite material, such as epoxy resin with filler, epoxy acrylate with filler, or polymer with proper filler. Encapsulant 274 is non-conductive and environmentally protects the semiconductor device from external elements and contaminants.

The circuits on active surface 244 of semiconductor die 242 and active surface 250 of semiconductor die 248 are electrically connected to build-up interconnect structure 262 by way of contact pads 246 and 256, bumps 254 and 272, bond wires 270, and conductive layer 266 for further package integration. Cavity 260 is formed adjacent to stress sensitive region 252 to create an air gap between semiconductor die 242 and sensitive region 252. Cavity 260 eliminates stress on sensitive region 252 to avoid device failure and adverse influence on signal processing of semiconductor die 248.

FIG. 11 shows an embodiment similar to FIG. 10 with conductive through silicon vias (TSV) 276 formed in semiconductor die 242. A plurality of vias is formed through semiconductor die 242 using laser drilling, mechanical drilling, or etching process, such as deep reactive ion etching (DRIE). The vias are filled with Al, Cu, Sn, Ni, Au, Ag, titanium (Ti), W, poly-silicon, or other suitable electrically conductive material using electrolytic plating, electroless plating process, or other suitable metal deposition process to form conductive TSV 276 for vertical interconnectivity. A conductive TSV can also be formed through semiconductor die 248.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
 providing a build-up interconnect structure including a plurality of insulating layers interleaved with a plurality of conductive layers;
 disposing a plurality of first conductive bumps on a bottom surface of the build-up interconnect structure;
 disposing a first semiconductor die on a top surface of the build-up interconnect structure with an active surface of the first semiconductor die oriented away from the build-up interconnect structure and an adhesive layer between the build-up interconnect structure and first semiconductor die;
 forming a bond wire extending from a first contact pad on the active surface of the first semiconductor die to the top surface of the build-up interconnect structure;
 disposing a second conductive bump on a second contact pad on the active surface of the first semiconductor die;
 providing a semiconductor wafer including a plurality of second semiconductor die including an active surface of each of the plurality of second semiconductor die comprising a stress sensitive region including a plurality of integrated passive devices (IPDs) for high frequency signal processing;
 depositing an underfill material on the active surfaces of the second semiconductor die while using a mask or screen disposed over the stress sensitive regions of the second semiconductor die to prevent the underfill material from extending onto the stress sensitive regions of the second semiconductor die;
 singulating the semiconductor wafer through the underfill material to separate the second semiconductor die;
 disposing one of the second semiconductor die over the first semiconductor die and build-up interconnect structure with the active surface and stress sensitive region of the second semiconductor die oriented toward the first semiconductor die;
 pressing the second conductive bump on the first semiconductor die into the underfill material on the second semiconductor die to bring the second conductive bump into contact with a third contact pad on the active surface of the second semiconductor die, wherein the underfill material provides an air gap between the first semiconductor die and the stress sensitive region of the second semiconductor die; and
 depositing an encapsulant over the build-up interconnect structure to fully cover the first semiconductor die, second semiconductor die, and bond wire, wherein side surfaces of the encapsulant are coplanar with side surfaces of the build-up interconnect structure.

2. The method of claim 1, further including providing the second conductive bump as one of a plurality of stacked stud bumps.

3. The method of claim 1, further including forming a plurality of through-silicon vias (TSV) through the first semiconductor die.

4. The method of claim 1, wherein pressing the second conductive bump between the first semiconductor die and second semiconductor die comprises compression bonding the second conductive bump to the third contact pad.

5. The method of claim 1, further including preventing the underfill material from extending onto the stress sensitive regions of the second semiconductor die by:
 disposing a screen over the stress sensitive regions; and
 using a squeegee to dispense the underfill material over areas of the semiconductor wafer not covered by the screen.

6. The method of claim 1, further including preventing the underfill material from extending over the stress sensitive regions of the second semiconductor die by:
 forming a mask directly on the stress sensitive regions;
 depositing the underfill material over the second semiconductor die around the mask; and
 removing the mask to leave a cavity in the underfill material.

7. A method of making a semiconductor device, comprising:
 providing a build-up interconnect structure;
 disposing a first semiconductor die over the build-up interconnect structure with an active surface of the first semiconductor die oriented away from the build-up interconnect structure;
 forming a bond wire extending from the active surface of the first semiconductor die to a top surface of the build-up interconnect structure;
 disposing a conductive bump on the active surface of the first semiconductor die;
 providing a semiconductor wafer including a plurality of second semiconductor die including a stress sensitive region of each of the second semiconductor die comprising a plurality of integrated passive devices (IPDs) for high frequency signal processing;

depositing an underfill material over the semiconductor wafer while using a mask or screen disposed over the stress sensitive regions of the second semiconductor die to prevent the underfill material from extending over the stress sensitive regions of the second semiconductor die;

singulating the semiconductor wafer through the underfill material to separate the second semiconductor die;

disposing one of the second semiconductor die over the first semiconductor die and build-up interconnect structure with the stress sensitive region of the second semiconductor die oriented toward the first semiconductor die;

pressing the conductive bump on the first semiconductor die into the underfill material on the second semiconductor die to bring the conductive bump into contact with the second semiconductor die, wherein a cavity of the underfill material provides an air gap between the first semiconductor die and the stress sensitive region of the second semiconductor die; and depositing an encapsulant over the build-up interconnect structure, first semiconductor die, and second semiconductor die, wherein side surfaces of the encapsulant are coplanar with side surfaces of the build-up interconnect structure.

8. The method of claim 7, further including providing the conductive bump as one of a plurality of stacked stud bumps.

9. The method of claim 7, further including forming a plurality of through-silicon vias (TSV) through the first semiconductor die.

10. The method of claim 7, wherein pressing the conductive bump between the first semiconductor die and second semiconductor die comprises compression bonding the conductive bump to the second semiconductor die.

11. The method of claim 7, further including preventing the underfill material from extending over the stress sensitive regions of the second semiconductor die by:
 disposing a screen over the stress sensitive regions; and
 using a squeegee to dispense the underfill material onto areas of the semiconductor wafer not covered by the screen.

12. The method of claim 7, further including preventing the underfill material from extending over the stress sensitive regions of the second semiconductor die by:
 forming a mask directly on the stress sensitive regions;
 depositing the underfill material over the second semiconductor die around the mask; and
 removing the mask to leave a cavity in the underfill material.

13. The method of claim 7, further including providing the IPDs to include a capacitor and an inductor for radio frequency (RF) signal processing.

14. A method of making a semiconductor device, comprising:
 providing an interconnect structure;
 disposing a first semiconductor die over the interconnect structure with an active surface of the first semiconductor die oriented away from the interconnect structure;
 disposing a conductive bump on the active surface of the first semiconductor die;
 depositing an underfill material over the first semiconductor die and contacting the bump while using a mask or screen to form a cavity in the underfill material over a portion of the first semiconductor die;
 providing a second semiconductor die including a stress sensitive region of the second semiconductor die comprising a plurality of integrated passive devices (IPDs) for high frequency signal processing;
 disposing the second semiconductor die over the first semiconductor die and interconnect structure with the stress sensitive region of the second semiconductor die aligned with the cavity in the underfill material and the conductive bump contacting the second semiconductor die; and
 depositing an encapsulant over the interconnect structure, first semiconductor die, and second semiconductor die, wherein a surface of the encapsulant is coplanar with a surface of the interconnect structure.

15. The method of claim 14, further including providing the conductive bump as one of a plurality of stacked stud bumps.

16. The method of claim 14, further including forming a plurality of through-silicon vias (TSV) through the first semiconductor die.

17. The method of claim 14, wherein pressing the conductive bump between the first semiconductor die and second semiconductor die comprises compression bonding the conductive bump to the second semiconductor die.

18. The method of claim 14, further including preventing the underfill material from extending over the portion of the first semiconductor die by:
 disposing a screen over the portion of the first semiconductor die; and
 using a squeegee to dispense the underfill material over areas of the first semiconductor die not covered by the screen.

19. The method of claim 14, further including preventing the underfill material from extending over the portion of the first semiconductor die by:
 forming a mask directly on the first semiconductor die;
 depositing the underfill material over the first semiconductor die around the mask; and
 removing the mask.

20. The method of claim 14, further including providing the IPDs to include a capacitor and an inductor for radio frequency (RF) signal processing.

* * * * *